United States Patent [19]
Hodel et al.

[11] Patent Number: 5,359,297
[45] Date of Patent: Oct. 25, 1994

[54] VCO POWER-UP CIRCUIT FOR PLL AND METHOD THEREOF

[75] Inventors: Michael W. Hodel, Mesa; William H. Gulliver, Gilbert, both of Ariz.

[73] Assignee: Motorola, Inc., Schaumburg, Ill.

[21] Appl. No.: 141,361

[22] Filed: Oct. 28, 1993

[51] Int. Cl.$^5$ .................. H03L 3/00; H03L 7/093
[52] U.S. Cl. ..................... 331/1 A; 331/14; 331/17; 331/25
[58] Field of Search ............ 331/1 A, 14, 17, 25

[56] References Cited

U.S. PATENT DOCUMENTS

| | | | |
|---|---|---|---|
| 4,743,864 | 5/1988 | Nakagawa et al. | 331/14 X |
| 4,970,408 | 11/1990 | Hanke et al. | 307/272.3 |
| 5,208,555 | 5/1993 | Graham et al. | 331/11 X |

Primary Examiner—Siegfried H. Grimm
Attorney, Agent, or Firm—Robert D. Atkins

[57] ABSTRACT

A power-on reset circuit controls a PLL to prevent overshoot of the VCO during power-up. The power-on reset circuit asserts a control signal upon detecting the power supply potential to the PLL below a predetermined threshold. The control signal enables a pull-down transistor to attenuate the control voltage to the VCO and reduce the output frequency of the VCO. The control signal further blocks the input reference signal to the phase detector. With the input reference signal blocked, the phase detector produces only down pulses to the charge pump during subsequent high to low logic transitions of the feedback signal from the VCO thereby further discharging the loop node and reducing the output frequency of the VCO. Following power-up, the control signal disables the pull-down transistor and allows the input reference signal to reach the phase detector whereby the PLL begins normal frequency acquisition and lock sequencing.

18 Claims, 1 Drawing Sheet

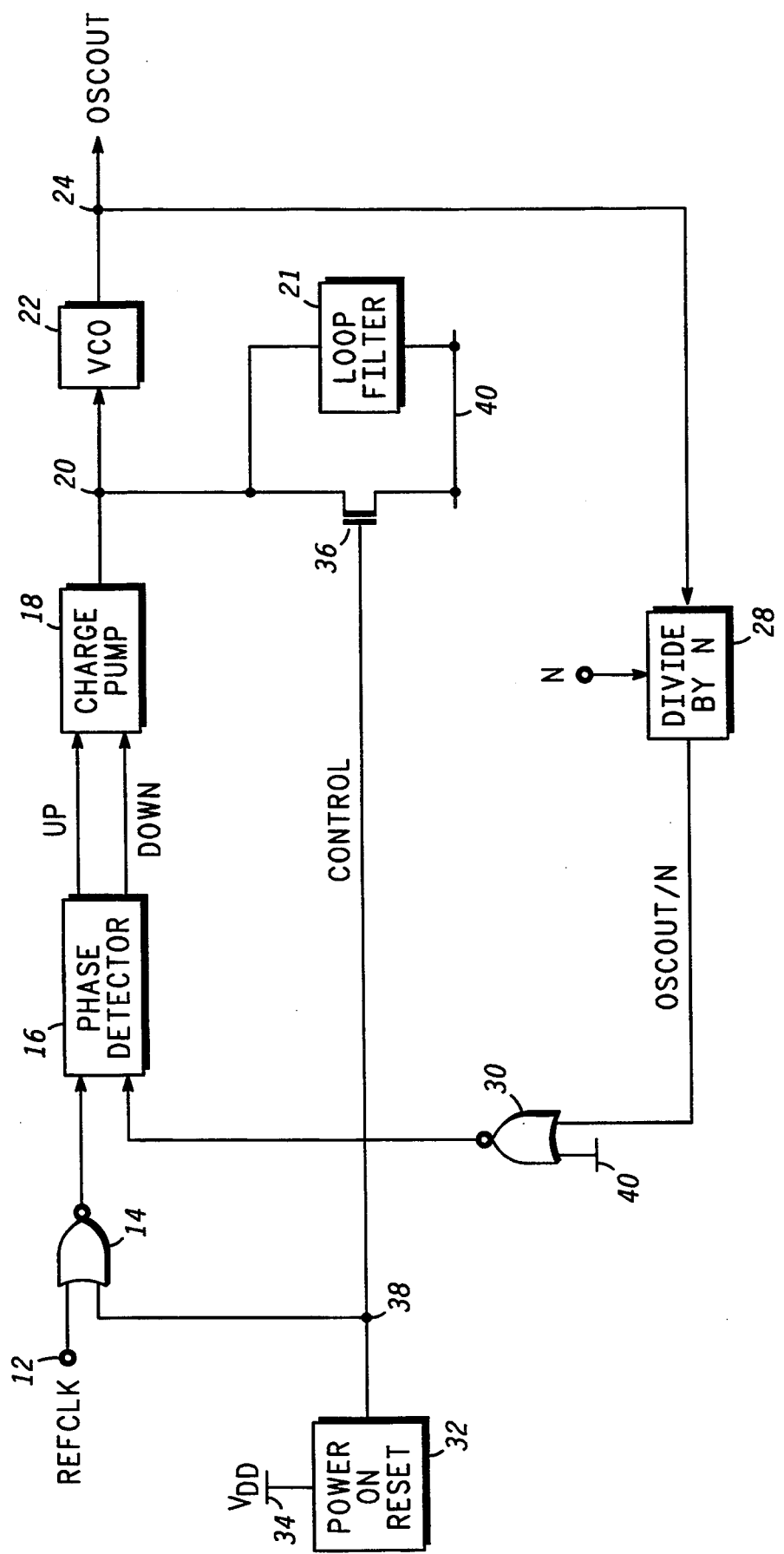

VCO POWER-UP CIRCUIT FOR PLL AND METHOD THEREOF

BACKGROUND OF THE INVENTION

The present invention relates in general to phase lock loops and, more particularly, to a VCO power-up circuit for a PLL.

A conventional phase lock loop (PLL) generally includes a phase detector for monitoring a phase difference between a input reference signal and an output signal of a voltage controlled oscillator (VCO). The phase detector generates an UP control signal and a DOWN control signal for a charge pump to charge and discharge a loop filter at a loop node at the input of the VCO. The loop voltage developed across the loop filter determines the output frequency of the VCO. The UP and DOWN control signals driving the charge pump set the proper loop filter voltage at the input of the VCO to maintain a predetermined phase relationship between the signals applied to the phase detector.

PLLs are widely used for example in data communications, local area networks in computer applications, microprocessors and data storage applications to generate a clock signal having a known phase to control data transfers. A common problem related to PLL operation occurs during power-up where the power supply potential to the PLL has not yet reached full operating levels. With power supply potential below operational levels, any spurious noise in the input reference signal may cause the VCO to overshoot the reference frequency and result in catastrophic failure. Although the PLL may be restarted, the same problem is just as likely to reoccur while the circuit is powering up.

Hence, a need exists to prevent overshoot of the VCO and ensure stable power-up of the PLL until the power supply potential to the PLL reaches full operating levels.

BRIEF DESCRIPTION OF THE DRAWING

The sole FIGURE is a block diagram illustrating a VCO power-up circuit in a PLL.

DETAILED DESCRIPTION OF THE PREFERRED EMBODIMENT

The present invention controls the operation of a VCO during the critical power-up phase of a PLL when the loop tracks and acquires lock to an input reference signal. In a first manner, a pull-down transistor coupled to the PLL loop node briefly reduces the control voltage to the VCO upon receiving a logic pulse from a power-on reset circuit during power-up. The VCO output frequency slows down accordingly. Secondly, the input reference signal to the phase detector may be blocked or disabled during power-up in response to the same logic pulse from the power-on reset circuit. During logic high to logic low transitions of the feedback signal to the phase detector, the charge pump discharges the VCO control voltage node again lowering the VCO start-up frequency.

A digital PLL 10 is shown in the drawing suitable for manufacturing as an integrated circuit using conventional CMOS integrated circuit processes. A digital input reference signal REFCLK operating at say 16 MHz is applied at input terminal 12 at a first input of NOR gate 14. The output of NOR gate 14 is coupled to a first input of phase detector 16 to generate an UP control signal and a DOWN control signal for charge pump 18. The output of charge pump 18 drives loop node 20 for charging and discharging loop filter 21 comprising, for example, a capacitor (not shown) coupled between loop node 20 and ground potential at power supply conductor 40. The loop voltage at loop node 20 controls VCO 22 for generating an oscillator signal OSCOUT operating at say 128 MHz at output terminal 24. Programmable divide-by-N circuit 28 receives an external control signal N to select the divisor N, e.g. N=8. The OSCOUT signal is frequency divided by programmable divide-by-N circuit 28 for providing an OSCOUT/N feedback signal as applied at a first input of NOR gate 30. The second input of NOR gate 30 is coupled to ground potential at power supply conductor 40. The output of NOR gate 30 is coupled to a second input of phase detector 16.

An UP control signal increases the loop voltage to increase the output frequency of VCO 22 while a DOWN control signal decreases the loop voltage to decrease the output frequency of VCO 22. The pulse width of the UP and DOWN control signals determines the amount of charge transferred to loop filter 21. The greater the phase difference between the input signal REFCLK and the OSCOUT/N signal, the greater the pulse width of the UP or DOWN control signal and the longer the charging current from charge pump 18 works to drive loop node 20 toward a voltage that alters the VCO frequency to minimize the phase difference. Thus, the mutually exclusive UP and DOWN control signals drive VCO 22 to maintain the predetermined phase relationship between the signals applied at the first and second inputs of phase detector 16.

As part of the present invention, power-on reset circuit 32 is responsive to power supply potential $V_{DD}$ on power supply conductor 34. Power-on reset circuit 32 provides a CONTROL signal to node 38 which is coupled to a second input of NOR gate 14 and to the gate of NMOS pull-down transistor 36. The drain of transistor 36 is coupled to loop node 20 and its source is coupled to power supply conductor 40. An embodiment of power-on reset circuit is disclosed in U.S. Pat. No. 4,970,408, entitled "CMOS POWER-ON RESET CIRCUIT", and is hereby incorporated by reference.

Power-on reset circuit 32, NOR gates 14 and 30, and transistor 36 provide the VCO power-up feature. Phase detector 16, charge pump 18, VCO 22 and divide-by-N circuit 28 represent the PLL. NOR gate 30 provides a delay for the OSCOUT/N feedback signal to match the delay imposed by NOR gate 14 on the input signal REFCLK during normal operation of PLL 10. Other logic circuits could be substituted for NOR gates 14 and 30 for blocking the input signal REFCLK while providing the needed matching propagation delay for the feedback signal.

During power-up, the CONTROL signal ramps up toward logic one as power supply potential $V_{DD}$ ramps toward 5.0 volts. Power-on reset circuit 32 thus provides a logic one CONTROL signal at node 38 enabling pull-down transistor 36 to attenuate the voltage at loop node 20. This reduces the output frequency of VCO 22. Simultaneous during the power up sequence, the logic one at node 38 blocks transmission of the REFCLK signal by way of NOR gate 14 from reaching the first input of phase detector 16. The output of NOR gate 14 goes to logic zero thereby disabling the REFCLK input signal.

During subsequent high to low logic transitions on the OSCOUT/N signal, phase detector 16 produces only DOWN pulses to charge pump 18 thereby further discharging loop node 20 and reducing the output frequency of VCO 22. Disabling NOR gate 14 eliminates undesirable spurious output pulses on the REFCLK signal from reaching the first input of phase detector 16 and prevents overshoot of VCO 22 output frequency during the start-up sequence. It is important to hold the output frequency of VCO 22 at a low operating frequency until the power supply potential $V_{DD}$ to PLL 10 reaches full operating levels.

Following the power-up sequence when the power supply potential $V_{DD}$ reaches operational levels, power-on reset circuit 32 returns the CONTROL signal at node 38 to ground potential thereby disabling transistor 36 and allowing loop node 20 to seek an appropriate operational voltage. Simultaneously, the logic zero CONTROL signal enables NOR gate 14 to pass the REFCLK input signal to the first input of phase detector 16. Phase detector 16 responds to phase and frequency differences detected between its first and second inputs. The VCO power-up circuit becomes functionally transparent to PLL 10 as it begins normal phase and frequency acquisition and lock sequencing.

In summary, the invention eliminates overshoot of the VCO during power-up and allows the PLL to smoothly lock to the reference signal by steadily increasing the VCO output frequency. The CONTROL signal is asserted during power-up upon detecting the power supply potential $V_{DD}$ below a predetermined threshold to force the VCO to begin operating in a low frequency mode. The VCO thus ramps up to the required operational frequency with minimal phase and frequency overshoot.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A phase lock loop, comprising:
   first means responsive to a first power supply potential for providing a first control signal while detecting said first power supply potential below a predetermined threshold;
   second means coupled for receiving a reference signal and operating in response to said first control signal for enabling and disabling said reference signal to an output;
   third means for comparing phase between said reference signal from said output of said second means and a feedback signal and generating a loop node voltage at a loop node;
   a voltage controlled oscillator having an input coupled to said loop node for providing an oscillator signal operating at a frequency as determined by said loop node voltage; and
   a divider circuit coupled for receiving said oscillator signal and providing said feedback signal.

2. The phase lock loop of claim 1 further including fourth means coupled to said loop node and operating in response to said first control signal for attenuating said loop node voltage.

3. The phase lock loop of claim 2 wherein said fourth means includes a first transistor having a gate, a drain and a source, said gate receiving said first control signal, said drain being coupled to said loop node, said source receiving a second power supply potential.

4. The phase lock loop of claim 1 wherein said second means including a first gating circuit having first and second inputs and an output, said first input receiving said reference signal, said second input receiving said first control signal, said output providing said reference signal to said third means.

5. The phase lock loop of claim 4 further including a second gating circuit having first and second inputs and an output, said first input receiving said feedback signal, said second input receiving a second power supply potential, said output providing said feedback signal to said third means.

6. The phase lock loop of claim 5 wherein said third means includes:
   a phase detector having first and second inputs and first and second outputs, said first input receiving said reference signal from said first gating circuit, said second input receiving said feedback signal from said second gating circuit; and
   a charge pump having first and second inputs and an output, said first and second inputs being coupled to said first and second outputs of said phase detector respectively, said output being coupled to said loop node.

7. The phase lock loop of claim 6 further including a loop filter coupled between said loop node and said second power supply potential.

8. A phase lock loop, comprising:
   first means responsive to a first power supply potential for providing a first control signal while detecting said first power supply potential below a predetermined threshold;
   second means for comparing phase between a reference signal and a feedback signal and generating a loop node voltage at a loop node;
   a voltage controlled oscillator having an input coupled to said loop node for providing an oscillator signal operating at a frequency as determined by said loop node voltage;
   third means coupled to said loop node and operating in response to said first control signal for attenuating said loop node voltage; and
   a divider circuit coupled for receiving said oscillator signal and providing said feedback signal.

9. The phase lock loop of claim 8 wherein said third means includes a first transistor having a gate, a drain and a source, said gate receiving said first control signal, said drain being coupled to said loop node, said source receiving a second power supply potential.

10. The phase lock loop of claim 8 further including fourth means coupled for receiving said reference signal and operating in response to said first control signal for enabling and disabling said reference signal to said second means.

11. The phase lock loop of claim 10 wherein said fourth means includes a first gating circuit having first and second inputs and an output, said first input receiving said reference signal, said second input receiving said first control signal, said output providing said reference signal to said second means.

12. The phase lock loop of claim 11 further including a second gating circuit having first and second inputs and an output, said first input receiving said feedback signal, said second input receiving a second power supply potential, said output providing said feedback signal to said second means.

13. The phase lock loop of claim 12 wherein said second means includes:
   a phase detector having first and second inputs and first and second outputs, said first input receiving said reference signal from said first gating circuit, said second input receiving said feedback signal from said second gating circuit; and
   a charge pump having first and second inputs and an output, said first and second inputs being coupled to said first and second outputs of said phase detector respectively, said output being coupled to said loop node.

14. The phase lock loop of claim 13 further including a loop filter coupled between said loop node and said second power supply potential.

15. A method of powering up a PLL, comprising the steps of:
   providing a first control signal having a first state while detecting a first power supply potential below a predetermined threshold and having a second state when said first power supply potential exceeds said predetermined threshold;
   disabling a reference signal to the PLL in response to said first state of said first control signal; and
   enabling said reference signal to the PLL in response to said second state of said first control signal.

16. The method of claim 15 further including the steps of:
   comparing phase between said reference signal and a feedback signal and generating a loop node voltage at a loop node;
   generating an oscillator signal operating at a frequency as determined by said loop node voltage; and
   dividing said oscillator signal for providing said feedback signal.

17. The method of claim 16 further including the step of delaying said feedback signal to match delays imposed by enabling and disabling said reference signal.

18. The method of claim 15 further including the step of attenuating said loop node voltage in response to said first state of said first control signal.

* * * * *